United States Patent
Itihasi

[11] Patent Number: 5,760,467
[45] Date of Patent: Jun. 2, 1998

[54] SEMICONDUCTOR DEVICE LEAD FRAME HAVING SUNK DIE PAD PORTIONS

[75] Inventor: Motomi Itihasi, Itami, Japan

[73] Assignee: Mitsubishi Denki Kabushiki Kaisha, Tokyo, Japan

[21] Appl. No.: 944,967

[22] Filed: Sep. 15, 1992

[30] Foreign Application Priority Data

Sep. 19, 1991 [JP] Japan ................... 3-239518

[51] Int. Cl.⁶ ................ H01L 23/495; H01L 23/48; H01L 27/14
[52] U.S. Cl. ............. 257/676; 257/785; 257/414; 257/666; 257/669; 73/700
[58] Field of Search .................. 257/669, 666, 257/670, 674, 676, 692, 419, 785; 338/4, 42; 73/720

[56] References Cited

U.S. PATENT DOCUMENTS

| | | |
|---|---|---|
| 4,287,501 | 9/1981 | Tominaga et al. ............ 257/419 |
| 4,595,945 | 6/1986 | Graver .................. 257/676 |
| 4,937,656 | 6/1990 | Kohara .................. 257/676 |
| 4,994,895 | 2/1991 | Matsuzaki et al. .......... 257/674 |
| 5,208,481 | 5/1993 | Kurita et al. ............. 257/666 |

FOREIGN PATENT DOCUMENTS

| | | |
|---|---|---|
| 3913221 | 4/1989 | Germany . |
| 56-94763 | 7/1981 | Japan .................. 257/666 |
| 63-40352 | 2/1988 | Japan .................. 257/676 |
| 63-84143 | 4/1988 | Japan . |
| 63-226051 | 9/1988 | Japan .................. 257/666 |
| 180051 | 3/1989 | Japan . |
| 1124244 | 5/1989 | Japan . |
| 1282853 | 11/1989 | Japan . |
| 2137253 | 5/1990 | Japan . |
| 2153557 | 6/1990 | Japan . |
| 2184059 | 7/1990 | Japan .................. 257/666 |

*Primary Examiner*—Teresa M. Arroyo
*Attorney, Agent, or Firm*—Leydig, Voit & Mayer, Ltd.

[57] ABSTRACT

A lead frame includes a die pad having a plurality of die pads including a main die pad and an auxiliary die pad respectively supported by a main die pad supporting lead and an auxiliary die pad supporting lead extending inwardly from opposite sides of a planar annular frame, thereby inhibiting vertical movement of the die pad to which a load member is die-bonded. This support prevents deformation and breaking of wires bonded to the load member and the lead frame.

2 Claims, 4 Drawing Sheets

SEMICONDUCTOR DEVICE LEAD FRAME HAVING SUNK DIE PAD PORTIONS

BACKGROUND OF THE INVENTION

1. Field of the Invention

The present invention relates to a semiconductor device lead frame in which a die pad for mounting a load member thereon is sunk below the frame portion when used, and particularly to the structure of the die pad.

2. Description of the Related Art

A lead frame for a semiconductor pressure sensor is described below as a semiconductor device lead frame in which a die pad for mounting a load member thereon is sunk below the frame portion when used. FIGS. 5 and 6 show a conventional lead frame of a semiconductor pressure sensor. FIG. 5 is a plan view of the lead frame, and FIG. 6 is a side view thereof, both drawings showing a state wherein a die pad is sunk. In the drawings, a lead frame 100 generally has a plurality of lead frame units 1 shown by the broken line in FIG. 5 and provided in a row in a frame portion 1a. Each of the lead frame units 1 comprises leads 2, a die pad 3 and die pad supporting leads 5 for supporting the die pad 3. A load member (refer to FIG. 7) is mounted on a die bonding area 7.

When the die pad 3 is sunk below the frame portion 1a, as shown in the drawings, it is desirable that the die pad 3 is placed at the substantially center of the frame portion 1a at a height suitable for electrically connecting the load member to the leads 2. The length of each of the die pad supporting leads 5 is thus determined in view of the state where the die pad 3 is sunk. The lead frame 100 is generally punched out of a thin metal plate. The lead frame 100 is a flat plate immediately after the formation thereof, and the die pad 3 is then sunk, as shown in the drawings. The die pad 3 in the lead frame 100 before being sunk is positioned in a portion of FIG. 5 lower than the die pad 3 shown in the drawing.

FIGS. 7 and 8 are sectional views showing the internal structure of a conventional semiconductor pressure sensor formed using the lead frame shown in FIGS. 5 and 6. FIGS. 7 and 8 are sectional views taken along planes which intersect right angles. Although, the leads 2 respectively connected to a chip 8 by Au wires 2a are, in fact, provided in a direction perpendicular to the plane of FIG. 7, the leads 2 are not shown in that figure. Similarly, although the die pad 2 are, in fact, provided in front of or behind the plane of FIG. 8, the die pad supporting leads 5 are not shown in that figure.

The semiconductor pressure sensor chip 8 for actually detecting pressure is bonded to a glass pedestal so as to form a vacuum chamber 20 between the sensor chip 8 and the pedestal 9. A semiconductor pressure detection element comprising the semiconductor pressure sensor chip 8 and the glass pedestal 9 is die-bonded as a load member to the die pad 3 by a glass pedestal fixing resin 12. The leads 2 are respectively electrically connected (wire bonding) to the terminals (not shown) on the upper surface of the semiconductor pressure sensor chip 8 by the Au wires 2a.

The package of the semiconductor pressure sensor comprises a package base 10 and a package cap 13 having a pressure inlet 13a. The portion of the die pad 3 on which the glass pedestal 9 is mounted is contained in the package base 10 and is fixed to the package base 10 by the die pad fixing resin 12. The package cap 13 is bonded to the package base 10 by sealing resin 14 so as to partially hold and fix the die pad supporting leads 5 and the leads 2.

The semiconductor pressure sensor chip 8 is bonded to the glass pedestal 9 so as to form the vacuum chamber 20. The air pressure in the vacuum chamber 20 serves as a reference pressure, and the central portion of the chip 8 is outwardly and inwardly deformed in accordance with the difference between the reference pressure and external pressure. The external pressure is introduced through the pressure inlet 13 of the package cap 13 which is sealed by sealing resin 14 so the external pressure does not escape outside of the cavity area 10a formed by the package base 10 and the package cap 13. A circuit, for example, four resistances connected in a bridge for detecting the deformation of the chip 8 is present on the upper surface of the sensor chip 8, and the output signal of the detection circuit changes in accordance with the external pressure. The electrical output signal is transmitted to the leads 2 from the semiconductor pressure sensor chip 8 through the Au wires 2a and led outside of the sensor.

The conventional lead frame used in a semiconductor pressure sensor or the like is configured as described above. When a semiconductor pressure sensor is produced, the glass pedestal to which the semiconductor pressure sensor chip is bonded is die-bonded to the die pad. The sensor chip is wire-bonded to the leads by the Au wires. The die pad is fixed in the package base, and the package cap is mounted. In using a conventional lead frame, after the die pad is die-bonded to the glass pedestal, the die pad is easily vertically moved by the weight of the glass pedestal until the die pad is fixed to the bottom of the package base. There is thus the problem that the Au wires for connecting the semiconductor pressure sensor chip and the leads may be deformed or broken during the vertical movement of the die pad.

SUMMARY OF THE INVENTION

Accordingly, the present invention has been achieved for solving the above problem, and an object of the present invention is to provide a semiconductor device lead frame which inhibits vertical movement of a die pad after a glass pedestal is die-bonded to the die pad and in which the wires are not easily broken.

In order to achieve the object, according to one aspect of the present invention, there is provided a semiconductor device lead frame in which a die pad portion for mounting a load member thereon is sunk below a frame portion when used, comprising at least one lead frame unit. The lead frame unit comprises the frame portion serving as an external frame, a divided die pad portion which is sunk below the frame portion within the frame portion when used and which comprises at least one main die pad and at least one auxiliary die pad, main die pad supporting leads and auxiliary die pad supporting leads each of which has a predetermined length so that the main die pad and the auxiliary die pad form a flat surface as the divided die pad portion when sunk, and which inwardly extend from the frame portion in different directions so as to respectively support the main die pad and the auxiliary die pad, and at least one lead inwardly extending from the frame portion and electrically connected to the load member so as to support the electrical connection of the load member.

According to another aspect of the present invention, there is provided a method of producing a semiconductor device using the above lead frame.

A semiconductor device lead frame according to the present invention comprising the divided die pad portions each having at least one main die pad and at least one auxiliary die pad, and the main and auxiliary die pad supporting leads extending from the frame portion in different directions so as to respectively support the main and auxiliary die pads, whereby the die pad is supported in a stable state. This support inhibits oscillation and vertical movement of the die pad, and particularly prevents breaking of wires during production.

DESCRIPTION OF THE PREFERRED EMBODIMENT

An embodiment of the present invention is described below with reference to the drawings.

Figure 1:
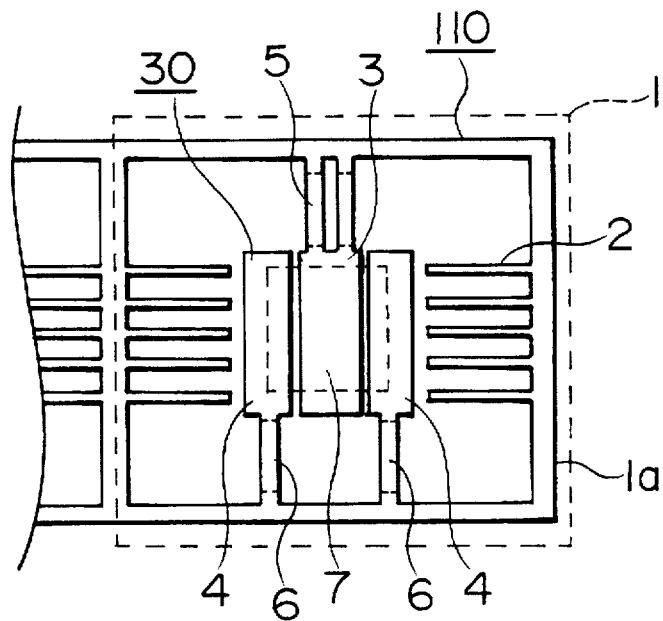
FIG. 1 is a plan view of a semiconductor device lead frame in accordance with an embodiment of the present invention.
Figure 2:
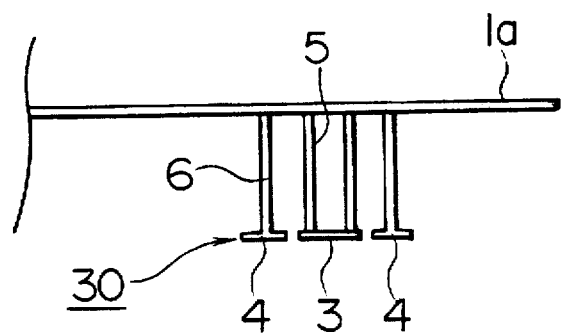
FIG. 2 is a side view of the lead frame shown in FIG. 1.

FIGS. 1 and 2 show a lead frame used in a semiconductor pressure sensor in accordance with an embodiment of the present invention. FIG. 1 is a plan view of the lead frame, and FIG. 2 is a side view of the same, both drawings showing the state wherein a die pad portion is sunk. In the drawings, portions which are the same as or equivalent to the elements of the conventional lead frame are denoted by the same reference numerals and are not described below. Each of the lead frame units 1 of a lead frame 110 has a die pad 30 comprising a main die pad 3 and two auxiliary die pads 4 on opposite sides of the main die pad 3. The main and auxiliary die pads 3 and 4 are respectively supported by a main die pad supporting lead 5 and auxiliary die pad supporting leads 6. The main die pad supporting lead 5 and the auxiliary die pad supporting leads 6 inwardly extended from and toward opposite sides of the frame portion 1a. The main die pad 3 and the auxiliary die pads 4 are positioned, when sunk, to form a planar surface as the die pad 30.

Figure 3:
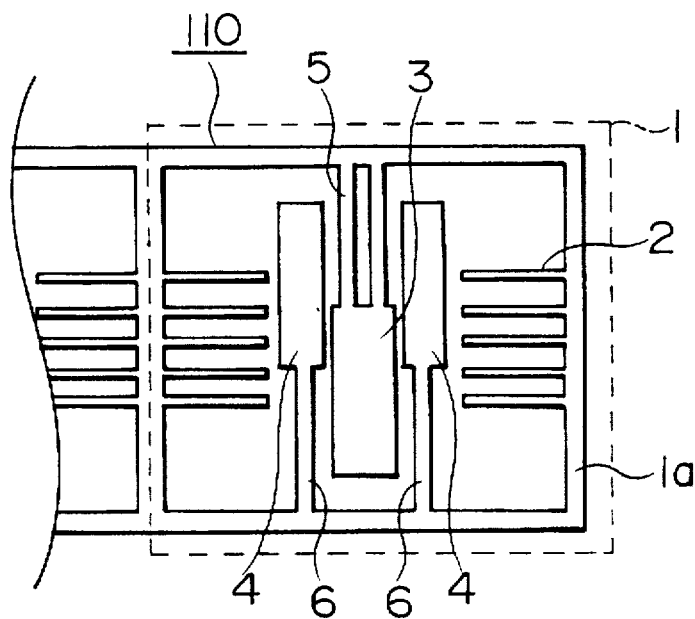
FIG. 3 is a plan view of the lead frame shown in FIG. 1 before a die pad portion is sunk.

FIG. 3 shows the state before the main die pad 3 and the auxiliary die pads 4 of the lead frame 110 are sunk. Each of the main die pad supporting lead 5 and the auxiliary die pad supporting leads 6 has a length determined in consideration of the state where the main die pad 3 and the auxiliary die pads 4 form the die pad 30 when sunk, as shown in FIG. 1.

Figure 4:
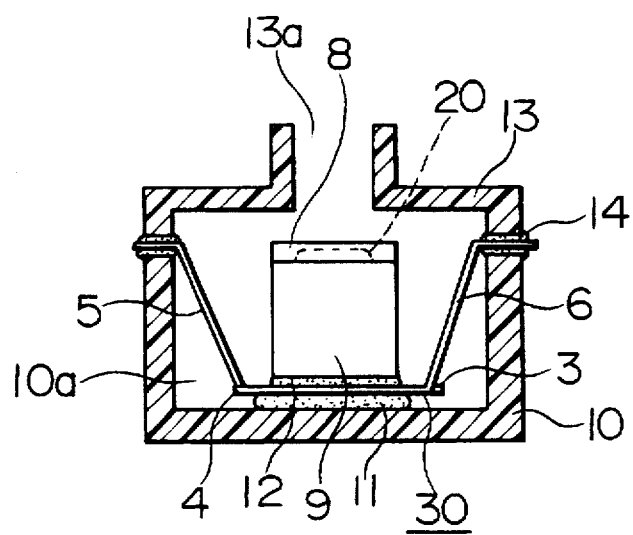
FIG. 4 is a sectional view of a semiconductor pressure sensor using the lead frame shown in FIG. 1.
Figure 5:
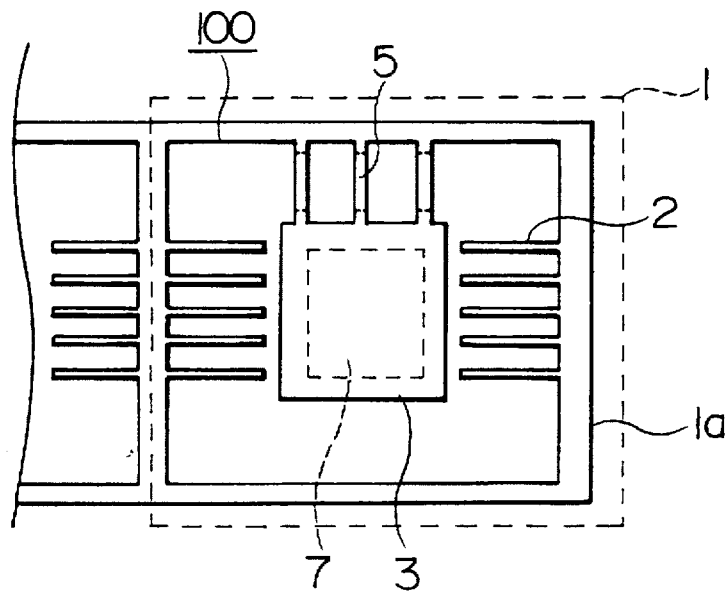
FIG. 5 is a plan view of a conventional semiconductor device lead frame.
Figure 6:
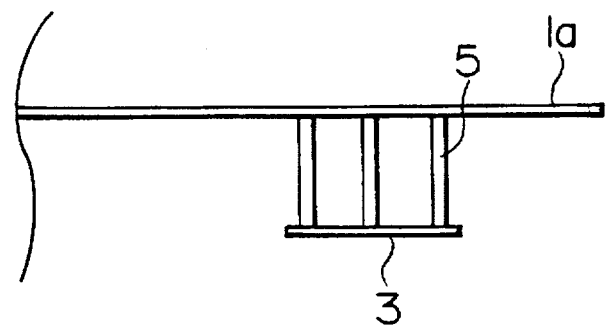
FIG. 6 is a side view of the lead frame shown in FIG. 5.
Figure 7:
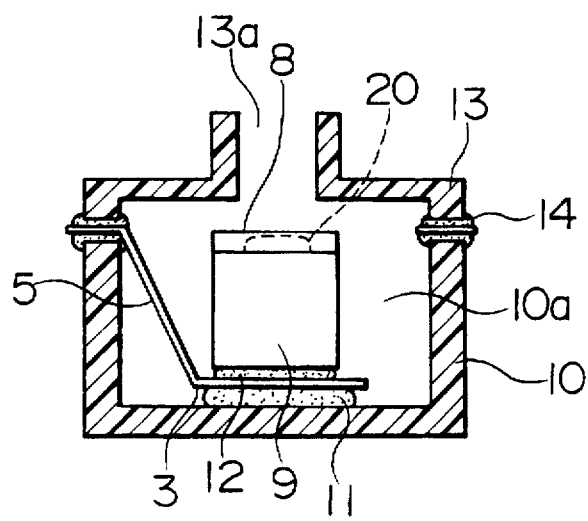
FIG. 7 is a sectional view of a semiconductor pressure sensor using the conventional lead frame shown in FIG. 5.
Figure 8:
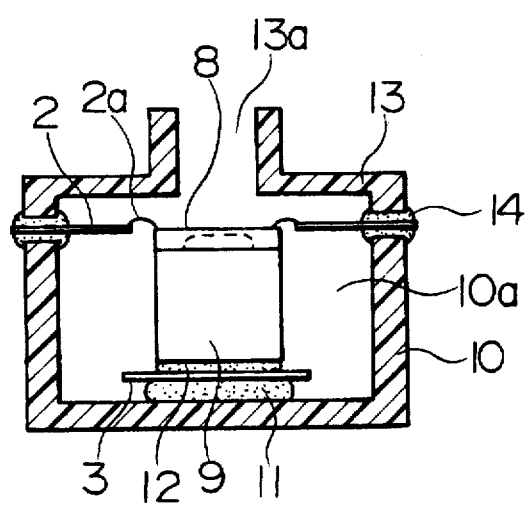
FIG. 8 is a sectional view of the semiconductor pressure sensor shown in FIG. 7 taken along a plane perpendicular to the sectional view of FIG. 7.

FIG. 4 is a sectional view showing the internal structure of a semiconductor pressure sensor using the lead frame shown in FIGS. 1 and 2. Although the leads 2 connected to the chip 8 by the Au wires 2a are, in fact, provided in the direction perpendicular to the plane of FIG. 4 (i.e., on the both sides in a direction perpendicular to each of the supporting leads), the leads 2 are not shown in FIG. 4. Since a sectional view of the semiconductor pressure sensor taken along a direction perpendicular to the direction of the sectional view of FIG. 4 is substantially the same as the sectional view of the conventional sensor shown in FIG. 8, it is omitted.

The process of producing the semiconductor pressure sensor is summarized below. The process comprises the step of sinking the main die pad 3 and the auxiliary die pads 4 below the frame portion 1a so as to form the die pad 30 as a flat surface, the die bonding step of fixing the semiconductor element (8, 9) on the die pad 30, the wire bonding step of electrically connecting the leads 2 to the semiconductor element (8, 9) by the wires 2a, and the step of containing and fixing the lead frame 110 which is subjected to die bonding and wire bonding in a package (10, 13). Excepting the step of sinking the die pad, the steps are basically the same as those of the conventional process.

As shown in FIG. 4, the die pad 30 formed by the main die pad 3 and the auxiliary die pads 4 are respectively supported by the main die pad supporting lead 5 and the auxiliary die pad supporting leads 6. During the production process, it is thus possible to prevent, referring to the orientation of the figures, vertical movement of the die pad 30 and prevent deformation and breaking of the Au wires 2a (refer to FIG. 8) connecting the leads 2 to the chip 8 even after the glass pedestal 9 having the semiconductor pressure sensor chip 8 bonded to the upper surface thereof is die-bonded to the die pad 30.

Although the embodiment described concerns the lead frame used in a semiconductor pressure sensor, the present invention is not limited to this, and the present invention can be applied to any semiconductor device lead frames in which the die pad is sunk when used. In addition, although, in the embodiment described, the die pad 30 is divided into three parts comprising the main die pad 3 and the auxiliary die pads 4, if the die pad portion is divided into two or four parts which are respectively supported by die pad supporting leads extending from the frame portion 1a in different directions, the same effects are obtained.

As described above, the semiconductor device lead frame of the present invention has the die pad divided into a plurality of die pad portions which are respectively supported by die pad supporting leads extending from the frame in opposite directions, thereby inhibiting vertical movement of the die pad portions on which a load member is die-bonded. The present invention thus prevents the deformation and breaking of the Au wires after wire bonding and has high reliability.

What is claimed is:

1. A lead frame and pressure sensor assembly comprising:
    a unitary lead frame including:
        an annular outer frame having four sides and lying in a first plane;
        a die pad disposed within said frame comprising one main die pad and two auxiliary die pads separate from and disposed on opposite sides of said main die pad, said main and auxiliary die pads being commonly disposed in a second plane spaced from the first plane;
        a main die pad supporting lead connected to a first side of said frame and to said main die pad and two auxiliary die pad supporting leads connected to a second side of said frame opposite the first side of said frame and to said two auxiliary die pads, respectively, each supporting lead having a predetermined length so that said main die pad and said two auxiliary die pads lie in the second plane, said main die pad supporting lead and said auxiliary die pad supporting leads respectively extending inwardly from said frame in opposite directions;
        at least one connecting lead extending inwardly from said frame for establishing an electrical connection to an element mounted on said main die pad and said two auxiliary die pads; and
        a semiconductor pressure detecting element mounted on said main die pad and said two auxiliary die pads.

2. The assembly of claim 1 wherein said semiconductor pressure detecting element comprises a semiconductor pressure sensor chip and a glass pedestal on which said sensor chip is mounted, said glass pedestal being mounted on said die pad.

* * * * *